(12) United States Patent
Gerhard et al.

(10) Patent No.: US 7,776,455 B2
(45) Date of Patent: *Aug. 17, 2010

(54) ORGANIC ELECTRONIC DEVICES

(75) Inventors: Anja Gerhard, Darmstadt (DE); Horst Vestweber, Gilserberg-Winterscheid (DE); Philipp Stössel, Frankfurt (DE)

(73) Assignee: Merck Patent GmbH (DE)

(*) Notice: Subject to any disclaimer, the term of this patent is extended or adjusted under 35 U.S.C. 154(b) by 320 days.

This patent is subject to a terminal disclaimer.

(21) Appl. No.: 10/590,037

(22) PCT Filed: Feb. 18, 2005

(86) PCT No.: PCT/EP2005/001710

§ 371 (c)(1),
(2), (4) Date: Aug. 18, 2006

(87) PCT Pub. No.: WO2005/084082

PCT Pub. Date: Sep. 9, 2005

(65) Prior Publication Data

US 2007/0170419 A1    Jul. 26, 2007

(30) Foreign Application Priority Data

Feb. 20, 2004  (DE) .................. 10 2004 008 304

(51) Int. Cl.
  *H01L 51/54* (2006.01)
  *C09K 11/00* (2006.01)
(52) U.S. Cl. ............. 428/690; 428/917; 313/504; 313/506; 252/301.16; 252/301.4 S; 252/301.4 P; 257/40; 257/102; 257/103; 257/E51.005; 549/28; 136/263
(58) Field of Classification Search .......... 428/690, 428/917; 313/504, 506; 257/40, E51.044, 257/E51.049; 568/9, 8, 12, 17, 20, 27, 287, 568/30, 34, 36; 136/263; 549/25, 27, 28, 549/46, 48, 53, 55
See application file for complete search history.

(56) References Cited

U.S. PATENT DOCUMENTS

| | | | | |
|---|---|---|---|---|
| 5,755,999 | A * | 5/1998 | Shi et al. ............... | 252/301.16 |
| 6,280,859 | B1 * | 8/2001 | Onikubo et al. ......... | 428/690 |
| 7,468,212 | B2 * | 12/2008 | Ogasawara et al. ...... | 428/690 |
| 2003/0170494 | A1 * | 9/2003 | Nii ......................... | 428/690 |
| 2004/0164294 | A1 * | 8/2004 | Son et al. ................. | 257/40 |

FOREIGN PATENT DOCUMENTS

| | | |
|---|---|---|
| EP | 0 786 926 | 7/1997 |
| EP | 1 318 143 | 6/2003 |
| EP | 1 426 429 | 6/2004 |
| JP | 2002/063989 A * | 2/2002 |
| JP | 2003-123972 | 4/2003 |
| JP | 2003-123973 | 4/2003 |
| JP | 2004-095221 | 3/2004 |
| WO | WO-03/104245 | 12/2003 |
| WO | WO-2004/093207 | 10/2004 |
| WO | WO-2005/003253 | 1/2005 |
| WO | WO-2005/040302 | 5/2005 |
| WO | WO-2005/054403 | 6/2005 |

OTHER PUBLICATIONS

Machine translation of JP 2002/063989 A (2002).*
A. Schmidt et al., "Electronic states of vapor deposited electron and hole transport agents and luminescent materials for light-emitting diodes," *J. Appl. Phys*, vol. 78, No. 9,, Nov. 1, 1995.

* cited by examiner

*Primary Examiner*—D. Lawrence Tarazano
*Assistant Examiner*—Michael Wilson
(74) *Attorney, Agent, or Firm*—Connolly Bove Lodge & Hutz LLP

(57) ABSTRACT

The present invention relates to the improvement of organic electronic devices, in particular fluorescent electroluminescent devices, by using electron-transport materials of the formula (1) to (4) as shown in scheme 1

(Scheme 1)

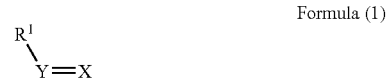

Formula (1)

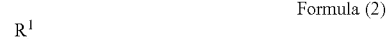

Formula (2)

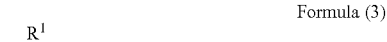

Formula (3)

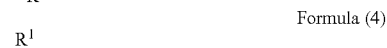

Formula (4)

23 Claims, No Drawings

ORGANIC ELECTRONIC DEVICES

RELATED APPLICATIONS

This application is a national stage application (under 35 U.S.C. 371) of PCT/EP2005/001710 filed Feb. 18, 2005, which claims benefit to German application 10 2004 008 304.5 filed Feb. 20, 2004.

The present invention describes the novel use of certain compounds in organic electronic devices.

The use of organic semiconductors has been reality for some time or is expected in the near future in a number of different applications which can be ascribed to the electronics industry in the broadest sense. The use of semiconducting organic compounds which are capable of the emission of light in the visible spectral region is just at the beginning of the market introduction, for example in organic electroluminescent devices. For simple devices containing OLEDs, the market introduction has already taken place, as confirmed by the car radios from Pioneer, the mobile telephones from Pioneer and SNMD and a digital camera from Kodak with an "organic display". Further products of this type are just about to be introduced. Organic solar cells (O-SCs), organic field-effect transistors (O-FETs), organic thin-film transistors (O-TFTs), organic integrated circuits (O-ICs), organic optical amplifiers or organic laser diodes (O-lasers) are well advanced at a research stage and could achieve major importance in the future.

The general structure of organic electroluminescent devices (OLEDs) is described, for example, in U.S. Pat. No. 4,539,507, U.S. Pat. No. 5,151,629, EP 0676461, WO 98/27136 and in WO 04/058911, where these devices usually consist of a plurality of layers. Organic solar cells (for example WO 98/48433, WO 94/05045), organic field-effect transistors (for example U.S. Pat. No. 5,705,826, U.S. Pat. No. 5,596,208, WO 00/42668), organic thin-film transistors, organic integrated circuits (for example WO 95/31833, WO 99/10939), organic optical amplifiers or organic laser diodes (for example WO 98/03566) have a similar general structure.

However, there are still considerable problems which require urgent improvement:

1. The efficiency has been improved in recent years, but is still too low, in particular in fluorescent OLEDs, and has to be improved.
2. The operating voltage and operating current are fairly high, in particular in fluorescent OLEDs, and therefore have to be reduced further in order to improve the power efficiency. This is of major importance, in particular for mobile applications.
3. The operating lifetime of the electronic devices is still short, meaning that it has hitherto only been possible to achieve simple applications commercially.
4. For many applications, thicker electron-transport layers are required than can be achieved using the materials used to date, since the charge-carrier mobility of these materials is inadequate.
5. The most-used electron conductor, $AlQ_3$, has various disadvantages, which are detailed below.

For many applications, it would be desirable to be able to use relatively thick layers of an electron-transport material. This would have the advantage that the occurrence of short circuits could thereby be reduced or even prevented entirely. Furthermore, this applies in particular if a combination of fluorescent blue and phosphorescent red and green OLEDs is used in displays. Since the phosphorescent OLEDs generally have a thicker layer structure, the fluorescent blue OLED must comprise a thicker electron-transport layer in order that the various OLEDs have the same thickness. However, since the electron mobility of the electron-transport compounds in accordance with the prior art is inadequate for this purpose, this is still not possible in practice.

Fluorescent electroluminescent devices which use $AlQ_3$ as electron conductor have already been known for some time and have already been described in 1993 in U.S. Pat. No. 4,539,507; $AlQ_3$ has since then been used as electron-transport material in most OLEDs. In the above-mentioned application, it is used as electron-transport material in the emission layer. However, $AlQ_3$ has a number of disadvantages: it cannot be vapour-deposited without leaving a residue since it partially decomposes at the sublimation temperature, which represents a major problem, in particular for production plants. This has the consequence that the vapour-deposition sources continually have to be purified or changed. Furthermore, decomposition products of $AlQ_3$ enter the OLED, where they contribute to a shortened lifetime and reduced quantum and power efficiency. A crucial practical disadvantage is the high hygroscopicity of $AlQ_3$. Synthesised and stored under normal conditions, $AlQ_3$ still contains, besides the hydroxyquinoline ligands, one molecule of water per complex molecule (H. Schmidbaur et al., *Z. Naturforsch.* 1991, 46b, 901-911), which is extremely difficult to remove. For use in OLEDs, $AlQ_3$ therefore has to be purified in a complex manner in complicated, multistep sublimation processes and subsequently stored and handled in a protective-gas atmosphere with exclusion of water. Furthermore, large variations in the quality of individual $AlQ_3$ batches and poor storage stability have been observed (S. Karg, E-MRS Conference 30.5.00-2.6.00, Strasburg). In addition, $AlQ_3$ has low electron mobility, which results in higher voltages and thus in lower power efficiency. In order to prevent short circuits in the display, it would be desirable to increase the layer thickness; this is not possible with $AlQ_3$ owing to the low charge-carrier mobility and the resultant increase in voltage. The charge-carrier mobility of other electron conductors (U.S. Pat. No. 4,539,507) is likewise too low in order to build up relatively thick layers therewith, with the lifetime of the OLED being even worse than on use of $AlQ_3$. Another very unfavourable factor proves to be the inherent colour (yellow in the solid state) of $AlQ_3$, which can result, in particular in blue OLEDs, in colour shifts due to re-absorption and weak re-emission. It is only possible to produce blue OLEDs here with considerable reductions in efficiency and shifts in colour location. A further disadvantage of the use of $AlQ_3$ is the instability to holes (Z. Popovic et al., *Proceedings of SPIE* 1999, 3797, 310-315), which, on long-term use, can always result in problems in the component.

In spite of the said disadvantages, $AlQ_3$ to date still represents the best compromise for the various requirements of an electron-transport material in OLEDs. A satisfactory electron-transport material has likewise not been found to date for the other applications mentioned.

There thus continues to be a demand for electron-transport materials which result in good efficiencies and at the same time in long lifetimes in organic electronic devices. Surprisingly, it has now been found that organic electronic devices which comprise certain compounds—mentioned below—as electron-transport materials have significant improvements over the prior art. These materials enable high efficiencies and long lifetimes to be obtained simultaneously, which is not possible with materials in accordance with the prior art. In addition, it has been found that the operating voltages can additionally be reduced significantly, which corresponds to higher power efficiencies, and in addition thicker electron-transport layers can be used, which reduces the frequency of short circuits or prevents them and brings further advantages already mentioned above.

The invention relates to an organic electronic device comprising cathode, anode and at least one organic layer, characterised in that the organic layer comprises at least one defined compound A containing the chemical structural unit Y═X, where the following applies to the symbols used:

Y is on each occurrence, identically or differently, P, As, Sb, Bi, S, Se or Te;

X is on each occurrence, identically or differently, O, S, Se, Te or NR;

R is on each occurrence, identically or differently, an organic radical having 1 to 22 carbon atoms or OH or $NH_2$;

with the proviso that the compound A has a molecular weight of $\geq$150 g/mol and $\leq$10,000 g/mol and that the device comprises no phosphorescent emitters; and furthermore with the proviso that the following compounds are excluded from the invention:

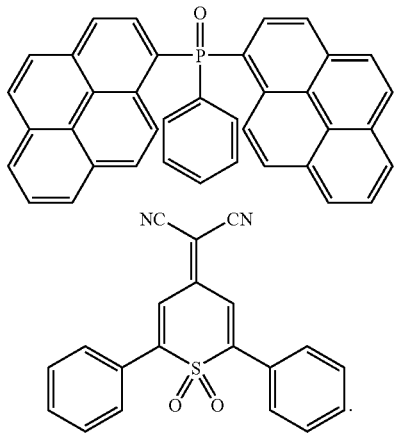

The symbol "═" used above and below stands for a double bond in the sense of the Lewis notation.

For the purposes of this invention, a "defined compound" will be taken to mean a compound which has a composition and structure to be described precisely. It is thus not taken to mean polymers or in general compounds having a molecular-weight distribution. Relatively small proportions of impurities, as always occur on use of organic materials, should not, however, devalue the term "defined compound".

Preference is given to organic electronic devices, characterised in that they comprise a compound A of the formula (1) to (4) (scheme 1)

(Scheme 1)

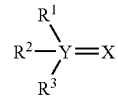

Formula (1)

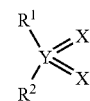

Formula (2)

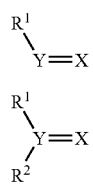

-continued

Formula (3)

Formula (4)

where the symbols used have the following meaning:

Y is on each occurrence, identically or differently, P, As, Sb or Bi in formulae (1) and (3) and S, Se or Te in formulae (2) and (4);

X is on each occurrence, identically or differently, $NR^4$, O, S, Se or Te;

$R^1$, $R^2$, $R^3$ is on each occurrence, identically or differently, $N(R^4)_2$, a straight-chain, branched or cyclic alkyl group having 1 to 40 C atoms, which may be substituted by $R^5$ or also unsubstituted, where one or more non-adjacent $CH_2$ groups may be replaced by —$R^6C$═$CR^6$—, —C≡C—, $Si(R^6)_2$, $Ge(R^6)_2$, $Sn(R^6)_2$, C═O, C═S, C═Se, C═$NR^6$, —O—, —S—, —$NR^6$— or —$CONR^6$— and where one or more H atoms may be replaced by F, Cl, Br, I, CN or $NO_2$; a plurality of radicals $R^1$, $R^2$ and/or $R^3$ here may with one another form a mono- or polycyclic, aliphatic or aromatic ring system;

or an aromatic or heteroaromatic system having 1 to 40 aromatic C atoms, which may be substituted by one or more radicals $R^5$, where a plurality of substituents $R^1$, $R^2$ and/or $R^3$ may with one another form a mono- or polycyclic, aliphatic or aromatic ring system, or an aromatic or heteroaromatic system having 1 to 40 aromatic C atoms which is bonded via a divalent group —Z—, where one or more H atoms may be replaced by F, Cl, Br or I or which may be substituted by one or more radicals $R^4$; a plurality of substituents $R^1$, $R^2$ and/or $R^3$ here may define a further mono- or polycyclic, aliphatic or aromatic ring system;

$R^4$ is on each occurrence, identically or differently, a straight-chain, branched or cyclic alkyl or alkoxy chain having 1 to 22 C atoms, in which, in addition, one or more non-adjacent C atoms may be replaced by —$R^6C$═$CR^6$—, —C≡C—, $Si(R^6)_2$, $Ge(R^6)_2$, $Sn(R^6)_2$, —$NR^6$—, —O—, —S—, —CO—, —CO—O—, —O—CO—O— and where one or more H atoms may be replaced by fluorine, or is an aryl, heteroaryl or aryloxy group having 1 to 40 C atoms, which may also be substituted by one or more radicals $R^6$, or OH, $NH_2$, $NH(R^5)$ or $N(R^5)_2$;

$R^5$ is on each occurrence, identically or differently, $R^4$ or CN, $B(R^6)_2$ or $Si(R^6)_3$;

$R^6$ is on each occurrence, identically or differently, H or an aliphatic or aromatic hydrocarbon radical having 1 to 20 C atoms;

Z is on each occurrence, identically or differently, a conjugated radical having 1 to 40 C atoms, which is preferably in conjugation with the two other substituents, where the number of atoms of Z which link the group Y═X and the aromatic radical is preferably an even number, where one or more C atoms may be substituted by a radical $R^5$ or halogen;

with the proviso that the molecular weight of the compound A is greater than 150 g/mol and less than 10,000 g/mol; and furthermore with the proviso that the following compounds are excluded from the invention:

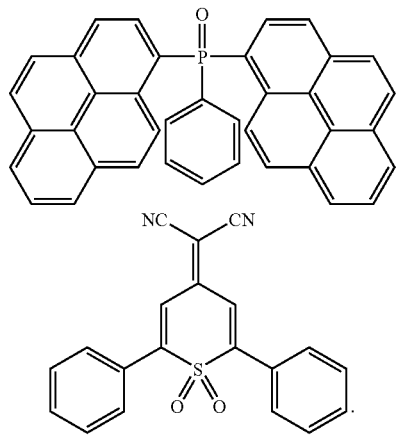

For the purposes of this invention, an aromatic or heteroaromatic system will be taken to mean a system which does not necessarily contain only aromatic or heteroaromatic groups, but in which two or more aromatic or heteroaromatic groups may also be interrupted by a short non-aromatic unit (preferably <10% of the atoms other than H), such as, for example, an sp$^3$-hybridised C, N or O atom. Thus, for example, systems such as 9,9'-spirobifluorene, 9,9-diarylfluorene, triarylamine, etc., will also be taken to be aromatic systems for the purposes of this application.

For the purposes of the present invention, a $C_1$- to $C_{22}$-alkyl group, in which, in addition, individual H atoms or $CH_2$ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl. A $C_1$- to $C_{22}$-alkoxy group is particularly preferably taken to mean methoxy, ethoxy, n-propoxy, i-propoxy, n-butoxy, i-butoxy, s-butoxy, t-butoxy or 2-methylbutoxy. A $C_1$-$C_{40}$ aromatic or heteroaromatic ring system, which may also in each case be substituted by the above-mentioned radicals $R^3$, is in particular taken to mean groups derived from benzene, naphthalene, biphenylene, terphenylene, fluorene, spirobifluorene, dihydrophenanthrene, tetrahydropyrene, cis- or trans-indeno-fluorene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

For the purposes of this invention, electronic devices are preferably organic electroluminescent devices (organic light-emitting diodes, OLEDs), organic thin-film transistors (O-TFTs), organic field-effect transistors (O-FETs), organic solar cells (O-SCs), organic photoreceptors or organic lasers (O-lasers), in particular organic electroluminescent devices.

Particular preference is given to an organic electronic device, characterised in that Y stands for P or S.

Particular preference is furthermore given to an organic electronic device, characterised in that X stands for O.

Particular preference is furthermore given to an organic electronic device, characterised in that at least one of the radicals $R^1$, $R^2$ and/or $R^3$ stands for an aromatic or heteroaromatic system; in particular, at least two of the radicals $R^1$, $R^2$ and/or $R^3$ stand for an aromatic or heteroaromatic system.

If one of the radicals $R^1$, $R^2$ and/or $R^3$ stands for an alkyl group, it is preferred for this to have no hydrogen atoms in the α-position to the group Y=X. This is due to the increased acidity of the protons in this position and therefore the increased reactivity. Thus, preferred alkyl groups are, for example, tert-butyl, adamantyl, norbornyl, etc.

Very particular preference is given to organic electronic devices, characterised in that the compounds containing units of the formulae (1), (2), (3) and (4) consist only of the elements carbon, hydrogen, oxygen and phosphorus or sulfur.

It may also be preferred here for the compound A to contain more than one unit Y=X or more than one unit of the formulae (1) to (4). A group $R^1$ or $R^2$ or $R^3$ can then also bridge two or more units Y=X.

Particularly suitable compounds of the formulae (1) to (4) have proven to be compounds which do not have a planar structure. In particular, corresponding substituents $R^1$, $R^2$ and/or $R^3$ may also ensure a deviation of the structure as a whole from planarity. This is the case, in particular, if at least one of the substituents $R^1$, $R^2$, $R^3$ and/or $R^4$ contains at least one sp$^3$-hybridised carbon, silicon, germanium and/or nitrogen atom which thus has approximately tetrahedral or, in the case of nitrogen, pyramidal bonding geometry.

In order to achieve a significant deviation from planarity, it is preferred for at least one of the sp$^3$-hybridised atoms to be a secondary, tertiary or quaternary atom, particularly preferably a tertiary or quaternary atom, in the case of carbon, silicon or germanium very particularly preferably a quaternary atom.

A secondary, tertiary or quaternary atom is taken to mean an atom having respectively two, three or four substituents other than hydrogen.

Preference is furthermore given to compounds which contain, in at least one of the radicals $R^1$ to $R^4$, a 9,9'-spirobifluorene derivative, preferably linked via the 2- and/or 2,7- and/or 2,2'- and/or 2,2',7- and/or 2,2',7,7'-position, a 9,9-disubstituted fluorene derivative, preferably linked via the 2- and/or 2,7-position, a 6,6- and/or 12,12-di- or tetrasubstituted indenofluorene derivative, a triptycene derivative, preferably linked via the 9- and/or 10-position, a dihydrophenanthrene derivative, preferably linked via the 2- and/or 2,7-position, or a hexaarylbenzene derivative, preferably linked via the p-position on the aromatic ring(s).

Particular preference is given to compounds which contain a 9,9'-spirobifluorene derivative in at least one of the radicals $R^1$ to $R^4$.

In a further preferred embodiment, at least one of the substituents $R^1$, $R^2$ and/or $R^3$ is a biaryl compound which has a non-planar structure due to rotation about the aryl-aryl axis. This is the case, in particular, if at least one of the aryl groups, preferably both, are substituted in the ortho-position to the aryl-aryl link, for example an ortho-linked biphenyl or a 1,1'-binaphthyl.

Preference is furthermore given to compounds which have a dendritic structure. Preference is also given to 1,3,5-trisubstituted benzenes.

Examples of suitable structures are the following Examples 1 to 52:

Example 1

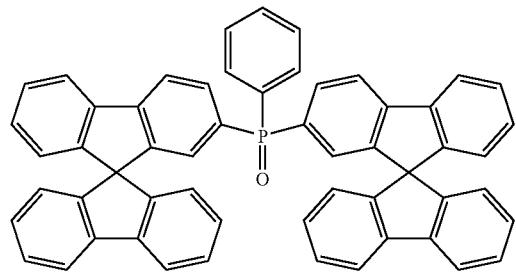

Example 2

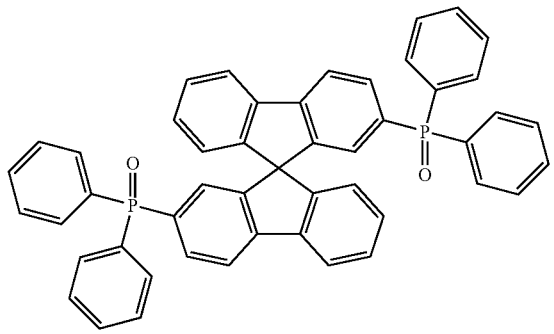

Example 3

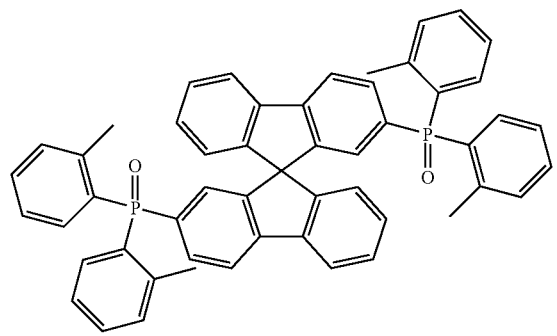

Example 4

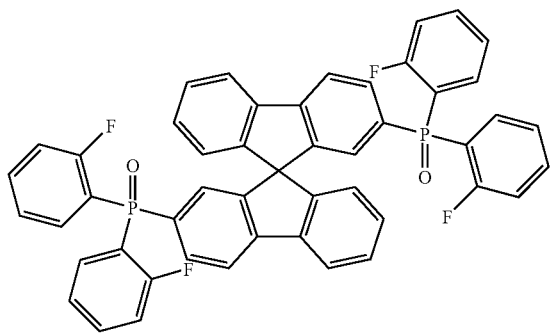

Example 5

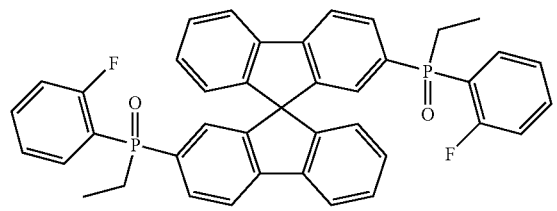

Example 6

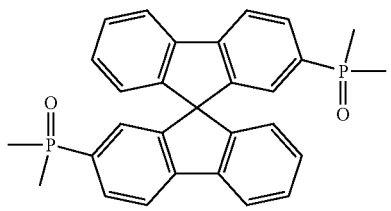

Example 7

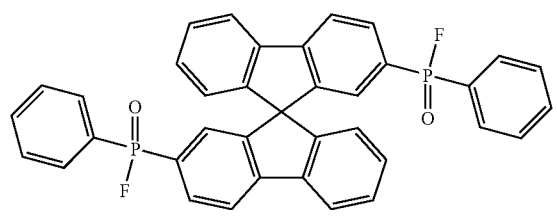

Example 8

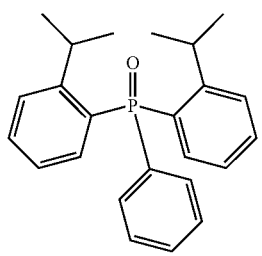

-continued
Example 9
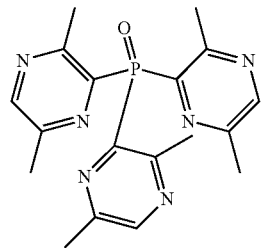
Example 10
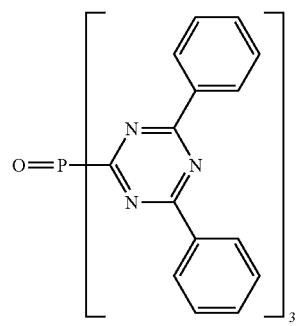
Example 11
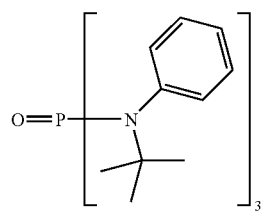
Example 12
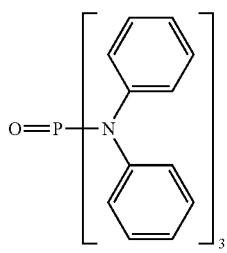
Example 13
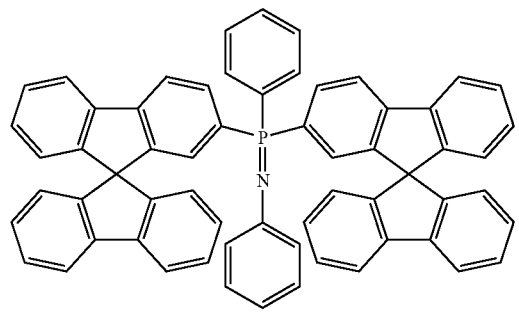
Example 14
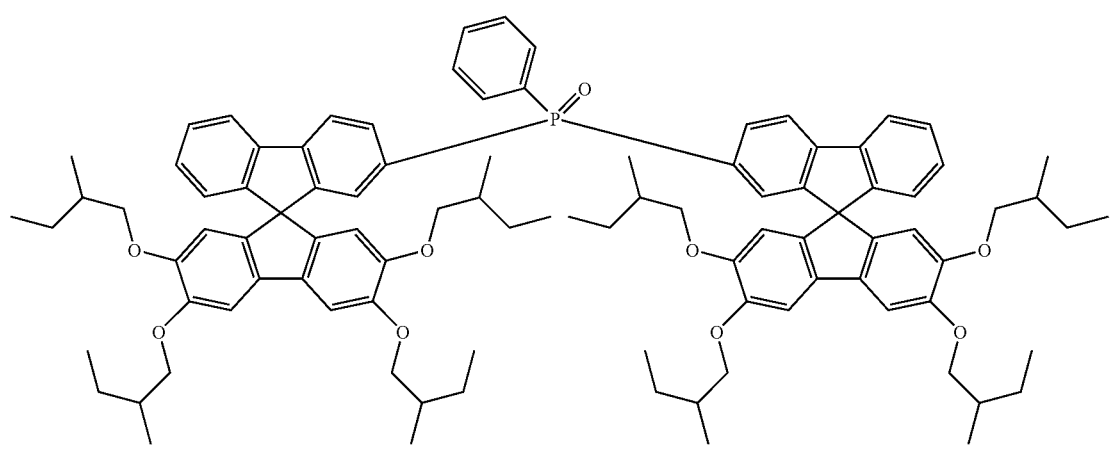

-continued
Example 15
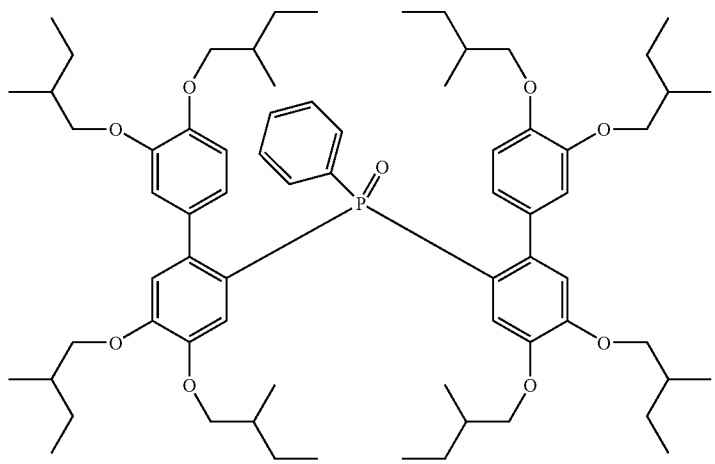
Example 16
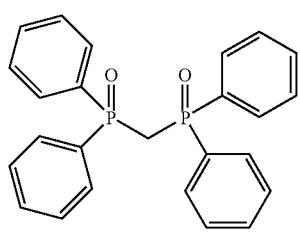
Example 17
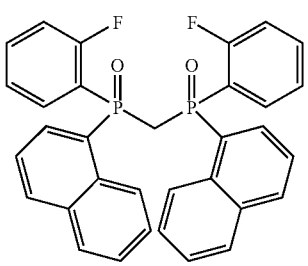
Example 18
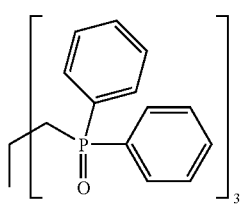
Example 19
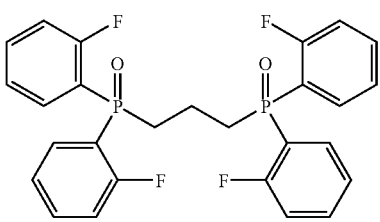
Example 20
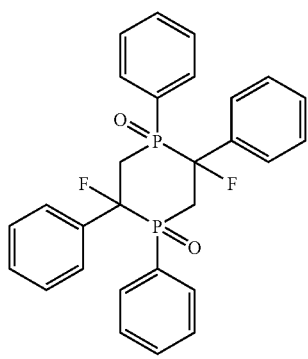
Example 21
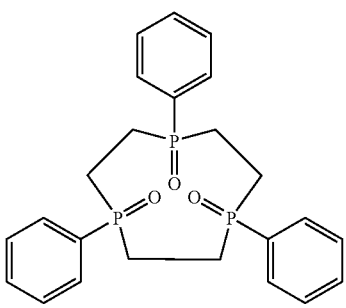

-continued
Example 22
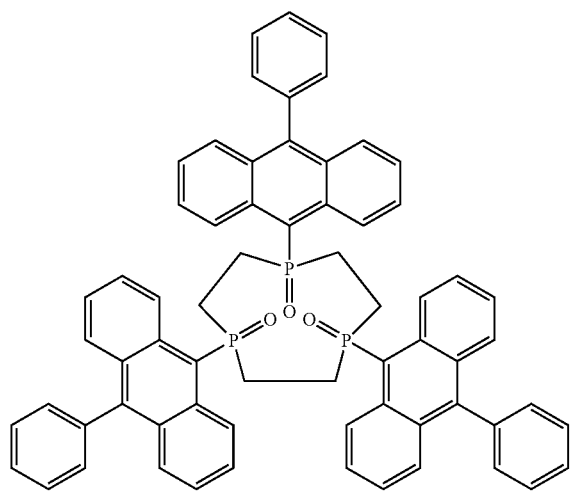
Example 23
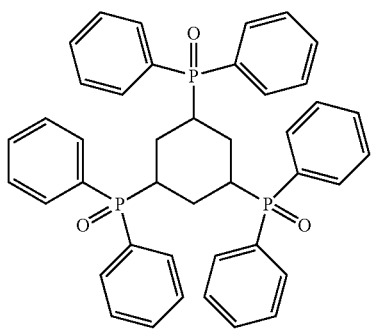
Example 24
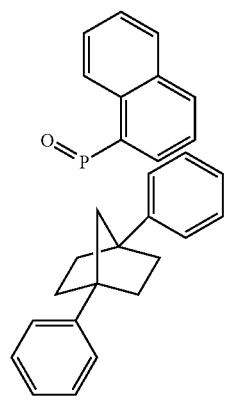
Example 25
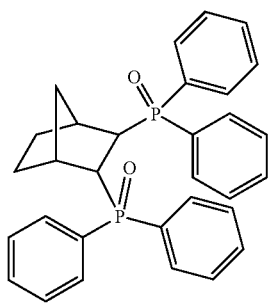
Example 26
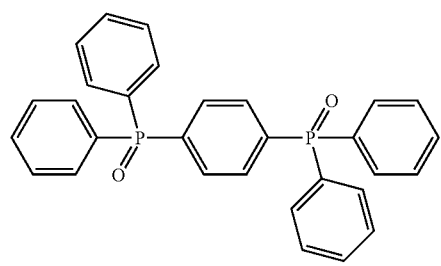
Example 27
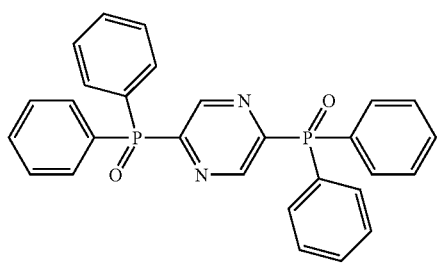
Example 28
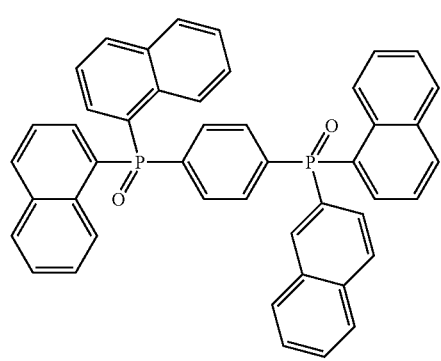
Example 29
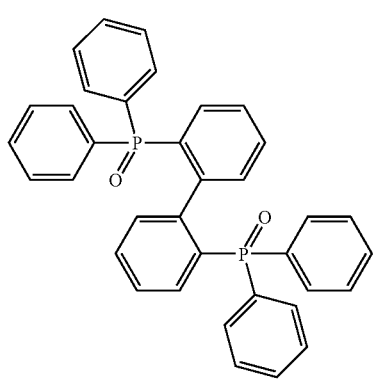

-continued
Example 30
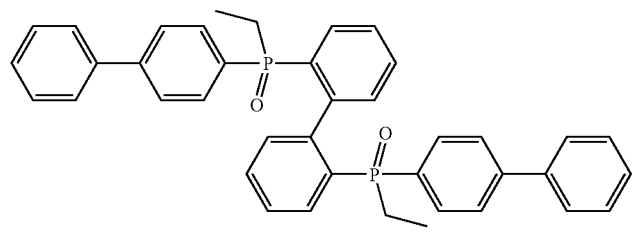
Example 31
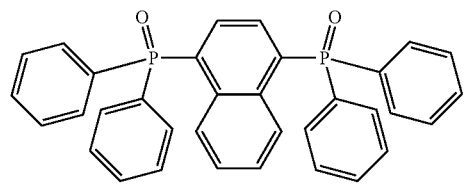
Example 32
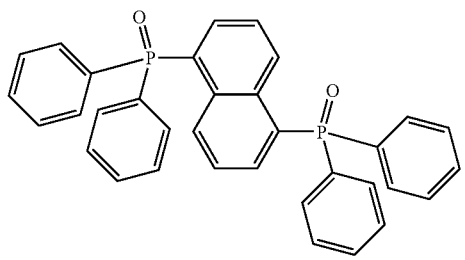
Example 33
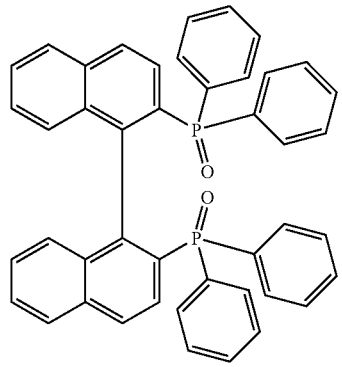
Example 34
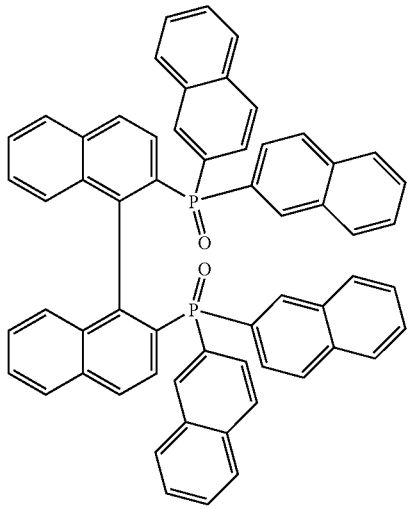
Example 35
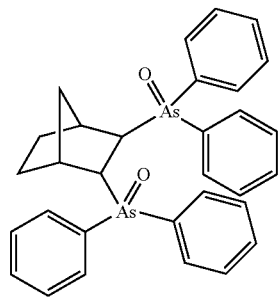
Example 36
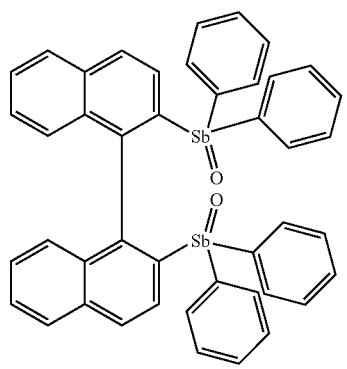

-continued
Example 37
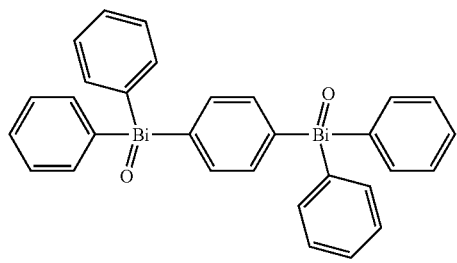
Example 38
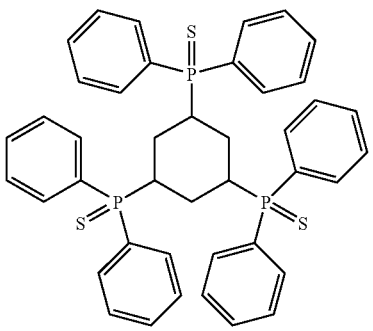
Example 39
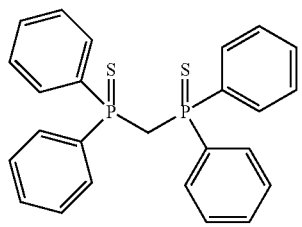
Example 40
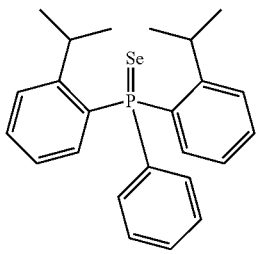
Example 41
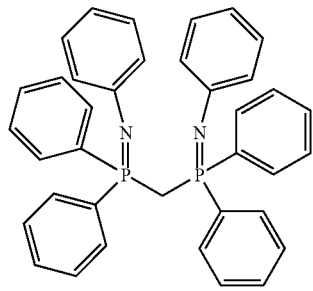
Example 42
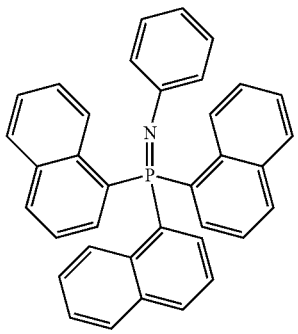
Example 43
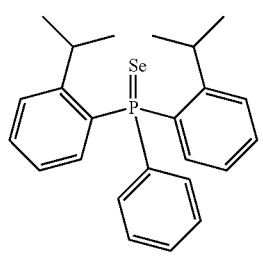
Example 44
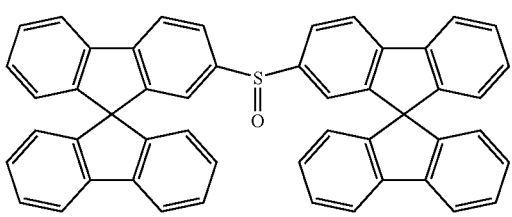
Example 45
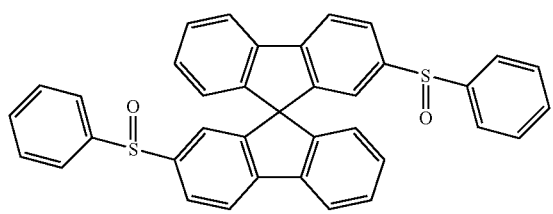
Example 46
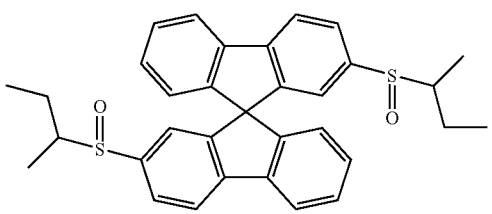

-continued

Example 47
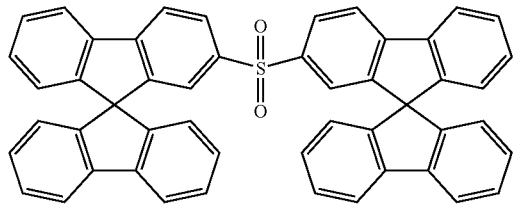

Example 48
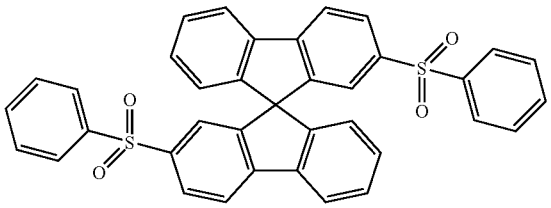

Example 49
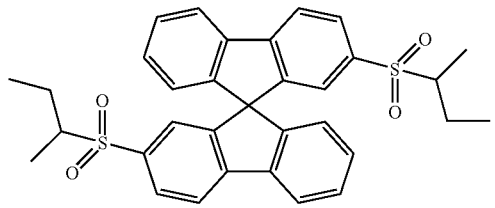

Example 50
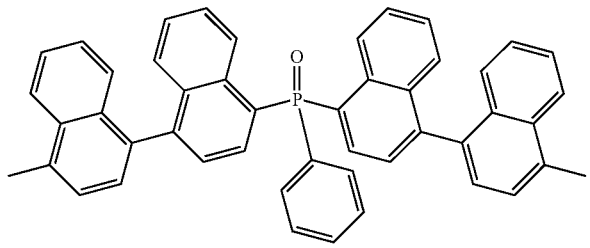

Example 51
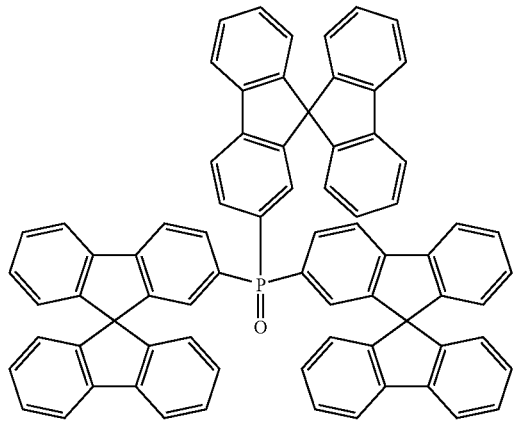

Example 52
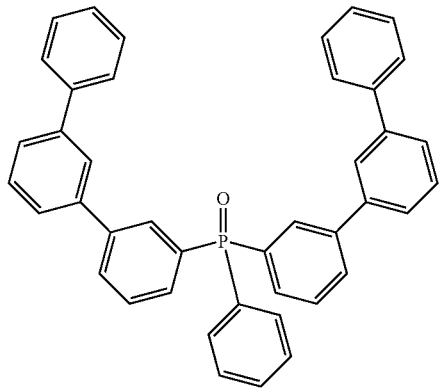

Preference is given to the use of compound A as electron-transport material. An electron-transport material is a material which predominantly conducts electrons in the electronic device.

Preference is furthermore given to an organic electronic device, characterised in that the layer comprising compound A consists of at least 50%, preferably of at least 80% of this compound and very particularly preferably only of compound A as pure layer. However, the use of a mixture of compound A and further compounds may also be preferred. The further compounds here may be either organic or inorganic, for example doping with a non-noble metal, such as, for example, alkali and/or alkaline-earth metals, or with an organometallic compound, such as, for example, $Co(Cp)_2$ or $Ni(Cp)_2$.

Preference is furthermore given to an organic electronic device, characterised in that the compound A is amorphous and the glass transition temperature $T_g$ of the compound A is greater than 100° C., particularly preferably greater than 130° C., in particular greater than 160° C.

In addition to the layer comprising the compound A, the organic electronic device may also comprise further layers. These can be, for example: hole-injection layer, hole-transport layer, emission layer, hole-blocking layer, electron-transport layer and/or electron-injection layer. However, it should be pointed out at this point that each of these layers does not necessarily have to be present. In an organic electroluminescent device, an emission layer is necessarily present.

A preferred aspect of the invention is an organic electroluminescent device according to the invention comprising at least one electron-transport layer between the fluorescent emission layer and the cathode, characterised in that the electron-transport material comprises at least one compound A.

The thickness of the electron-transport layer is preferably between 5 and 500 nm, particularly preferably between 10 and 100 nm, very particularly preferably between 20 and 70 nm.

It has been observed here that the electron-transport material according to the invention has higher charge-carrier mobility compared with known electron-transport materials, such as, for example, $AlQ_3$, which represents a technological advantage since greater layer thicknesses of this material can consequently be used.

A further preferred aspect of the invention is an organic electroluminescent device according to the invention, characterised in that the emission layer comprises at least one fluorescent emitter and at least one electron-transport material, where the electron-transport material comprises at least one compound A. It is not absolutely necessary here for the compound A to be present in a large proportion as host in the layer. Even a small proportion of compound A can significantly improve the electron-conducting properties of the emission layer.

It may also be preferred for both an electron-transport layer comprising at least one compound A and an emission layer comprising at least one compound A, which may be identical or different, to be present in the organic electroluminescent device.

It may furthermore be preferred for the emission layer comprising the compound A to be directly adjacent to the electron-injection layer or the cathode in an organic electroluminescent device without the use of a separate electron-transport layer. It may likewise be preferred for the emission layer comprising the compound A to be directly adjacent to the hole-injection layer in an organic electroluminescent device.

Preference is furthermore given to an organic electroluminescent device, characterised in that the emitter(s) fluoresce(s) in the visible spectral region with one or more maxima between 380 nm and 750 nm on suitable excitation. It may also be preferred here for the emitters to have a plurality of different emission maxima, so that white emission results overall.

Preference is furthermore given to an organic electronic device, characterised in that one or more layers are coated by a sublimation process. The materials here are vapour-deposited in vacuum sublimation units at a pressure below $10^{-5}$ mbar, preferably below $10^{-6}$ mbar, particularly preferably below $10^{-7}$ mbar.

Preference is likewise given to an organic electronic device, characterised in that one or more layers are coated by the OVPD (organic vapour phase deposition) process or with the aid of carrier-gas sublimation. The materials are applied here at a pressure between $10^{-5}$ mbar and 1 bar.

Preference is furthermore given to an organic electronic device, characterised in that one or more layers are produced from solution, such as, for example, by spin coating, or by any desired printing process, such as, for example, screen printing, flexographic printing or offset printing, but particularly preferably LITI (light induced thermal imaging, thermal transfer printing) or ink-jet printing.

The emitting devices described above have the following surprising advantages over the prior art:
1. The efficiency of corresponding devices is increased compared with systems which comprise, in accordance with the prior art, $AlQ_3$ as electron-transport material.
2. The stability of corresponding devices is increased compared with systems which comprise, in accordance with the prior art, $AlQ_3$ as electron-transport material.
3. The operating voltage is significantly reduced. The power efficiency is consequently increased. This applies, in particular, if a separate electron-transport layer is not used.
4. In particular, blue OLEDs can be produced in better colour purity since the compounds A are colourless and do not impair the efficiency and colour of the OLED due to re-absorption and re-emission.
5. Since the compounds A are generally not hygroscopic, they can be processed more easily and with less technical complexity compared with $AlQ_3$.
6. Since the compounds A have higher charge-carrier mobility than electron-transport materials in accordance with the prior art, such as, for example, $AlQ_3$, thicker electron-transport layers can be used. This is, as already described above, important for preventing short circuits and is furthermore necessary, in particular, for the combination of fluorescent and phosphorescent OLEDs in a display, since the greater layer thicknesses of the phosphorescent OLEDs must be compensated by a thicker electron-transport layer of the fluorescent OLEDs.

The present application text and also the further examples below are directed, in particular, to organic light-emitting diodes and the corresponding displays. In spite of this restriction of the description, it is possible for the person skilled in the art, without further inventive step, to use compounds A or compounds of the formulae (1) to (4) for related devices too, for example for organic solar cells, organic thin-film transistors, organic field-effect transistors or organic laser diodes.

EXAMPLES

The following syntheses were carried out, unless indicated otherwise, under a protective-gas atmosphere. The starting materials were purchased from ALDRICH or ABCR (solvents, magnesium, n-BuLi, phosphorus trichloride, thionyl chloride). 2,2'-Bis(diphenylphosphinoyl)-1,1'-binaphthyl (H. Takaya et al., *Organic Synthesis* 1989, 67, 20) was prepared by literature methods and purified as described below. Bis(9,9'-spirobifluoren-2-yl)phenylphosphine oxide (E1) and bis(9,9'-spirobifluoren-2-yl) sulfoxide (E3) were synthesised as described in WO 05/003253.

Synthesis Example 1 rac-2,2'-Bis(diphenylphosphinoyl)-1,1'-binaphthyl (E2)

The 2,2'-bis(diphenylphosphinoyl)-1,1'-binaphthyl obtained by the above-mentioned procedure was purified as follows: firstly, 50 g of the crude product were placed in a Soxhlett extractor and extracted with chloroform through a glass-fibre extraction thimble (pore size 0.1 µm). The chloroform was concentrated to a volume of 100 ml, and 500 ml of ethanol were added. The resultant precipitate was filtered off with suction and washed with ethanol. The precipitate was subsequently washed five times by stirring with 1000 ml of ethyl acetate under reflux each time. The sublimation was carried out at T=325° C., p=5×10$^{-5}$ mbar in a static vacuum. $T_m$=308° C., $T_g$=138° C. The yield of pure 2,2'-bis(diphenylphosphinoyl)-1,1'-binaphthyl was 37.3 g, with a purity of >99.9% (according to HPLC).

Synthesis Example 2

Tris(9,9'-spirobifluoren-2-yl)phosphine oxide (E4)

A solution of the corresponding Grignard reagent was prepared from 14.10 g (580 mmol) of magnesium which had been dried by heating and a solution of 197.65 g (500 mmol) of 2-bromo-9,9'-spirobifluorene in a mixture of 1500 ml of THF, 300 ml of dimethoxyethane and 4.8 ml (50 mmol) of 1,2-dichloromethane. A mixture of 12.2 ml (140 mmol) of phosphorus trichloride in 200 ml of THF was added dropwise over the course of 30 min. to this Grignard reagent at 20° C. The mixture was subsequently stirred under reflux for a further 3 h and at room temperature for 16 h. After addition of 5 ml of water, the reaction mixture was evaporated to dryness in a rotary evaporator (1 mbar, 90° C.). The residue was taken up in 1000 ml of dichloromethane and washed three times with 500 ml of water. A mixture of 21 ml of hydrogen peroxide (35% by weight) and 80 ml of water was added dropwise to the dichloromethane phase with vigorous stirring. After stirring for 24 h, the aqueous phase was separated off. The organic phase was washed three times with 500 ml of water each time and then concentrated to a volume of 200 ml. After addition of 1000 ml of ethanol, the microcrystalline precipitate was filtered off with suction and washed with 200 ml of ethanol. The purification was carried out by repeated recrystallisation from DMSO (about 10 ml/g). Finally, the product was dissolved in 1000 ml of NMP and precipitated at 100° C. by addition of 1000 ml of ethanol in order to remove DMSO included in the crystal lattice. The sublimation was carried out at T=445° C., p=5×10$^{-5}$ mbar in a static vacuum. $T_m$=433° C., $T_g$=137° C. The yield of tris(9,9'-spirobifluoren-2-yl)phosphine oxide was 76.0 g (76 mmol), corresponding to 54.6% of theory, with a purity of >99.9% (according to HPLC).

$^1$H-NMR (CDCl$_3$): δ [ppm]=7.80 (d, 3H), 7.73 (dd, 6H), 7.64 (dd, 3H), 7.35 (dd, 3H), 7.28 (dd, 6H), 7.13 (dd, 3H), 7.09 (dd, 6H), 7.02 (dd, 6H), 6.69 (d, 3H), 6.55 (d, 6H). $^{31}$P{$^1$H}-NMR (CDCl$_3$): δ [ppm]=31.6 (s).

Production of OLEDs:

OLEDs were produced by a general process as described in WO 05/003253, which had to be adapted in individual cases to the particular circumstances (for example layer-thickness variation in order to achieve optimum efficiency or colour).

The results of various OLEDs are presented in the following examples. The basic structure and layer thicknesses, apart from the emission layer and the electron-transport layer, were identical for better comparability. OLEDs having the following structure were produced analogously to the above-mentioned general process:

Hole-injection layer (HIL) 60 nm PEDOT (spin-coated from water; purchased from H. C. Starck; poly(3,4-ethylenedioxy-2,5-thiophene)

Hole-transport layer (HTL) 20 nm NaphDATA (vapour-deposited; purchased from SynTec; 4,4',4''-tris(N-1-naphthyl-N-phenylamino)triphenylamine Hole-transport layer (HTL) 20 nm S-TAD (vapour-deposited; prepared in accordance with WO 99/12888; 2,2',7,7'-tetrakis(diphenylamino)spiro-9,9'-bifluorene)

Emission layer (EML) 30 nm-40 nm (precise structure see examples in Table 1)

Electron conductor (ETC) 10 nm-50 nm (precise structure see examples in Table 1) (vapour-deposited: AlQ$_3$ purchased from SynTec; tris(quinolinato)aluminium(III) or bis(9,9'-spirobifluoren-2-yl)phenylphosphine oxide) (synthesised in accordance with the unpublished application DE 10330761.3))

Ba/Al (cathode) 3 nm Ba, 150 nm Al on top.

These still unoptimised OLEDs were characterised by standard methods; for this purpose, the electroluminescence spectra, the efficiency (measured in cd/A), the power efficiency (measured in lm/W) as a function of the brightness, calculated from current-voltage-brightness characteristic lines (IUL characteristic lines), and the lifetime were determined. The lifetime is defined as the time after which the initial brightness of the OLED has dropped to half at a constant current density of 10 mA/cm$^2$. For the electron-transport layer, the layer thickness was optimised separately for each material. For better comparison, however, the greater AlQ$_3$ layer thicknesses, which are directly comparable with the layer thicknesses of E1 to E4, are also shown.

Table 1 shows the results of some examples, with the composition of the ETC including the layer thicknesses also being shown in each case. The ETCs comprise, for example, as electron-transport material the compound E1 bis(9,9'-spirobifluoren-2-yl)phenylphosphine oxide or the other electron-transport materials E2 to E4. Alternatively or additionally, these materials are also used in the emission layer. The comparative examples used are OLEDs which comprise AlQ$_3$ as electron conductor in accordance with the prior art. For better clarity, the corresponding structural formulae of the electron-transport compounds used are shown below:

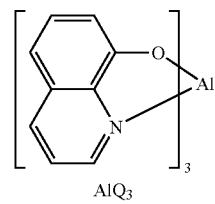

AlQ$_3$

E1

E2

E3

E4

E5

In addition, the structures of the emitters used (or further components of the emission layer) are shown below:

EM1
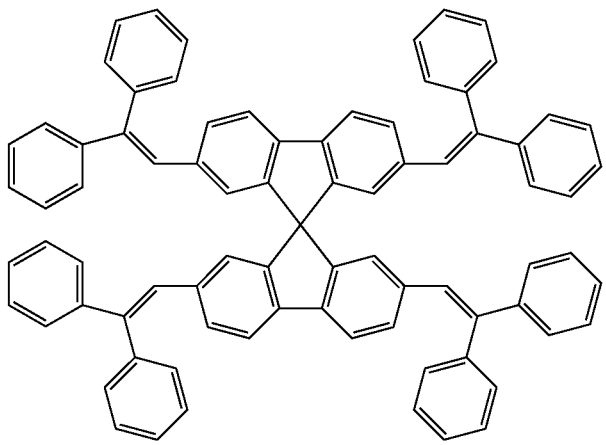
EM2
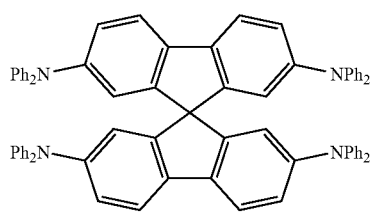
EM3
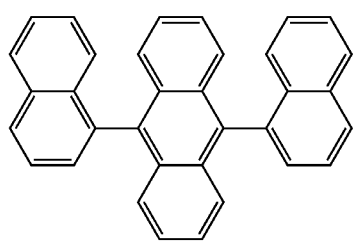
EM4
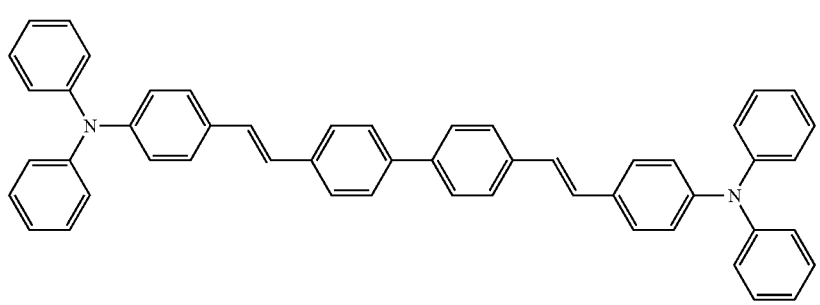
EM5
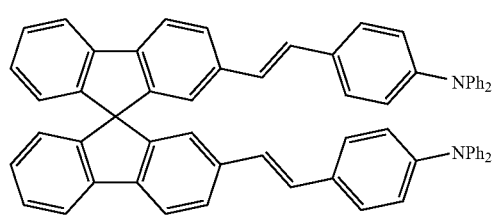
EM6

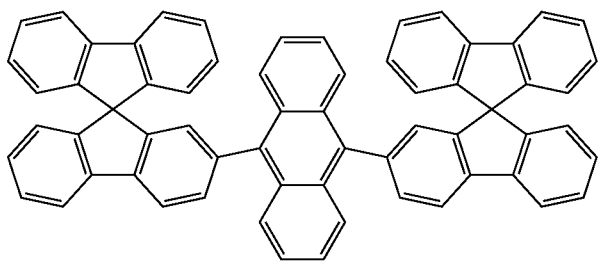

EM7

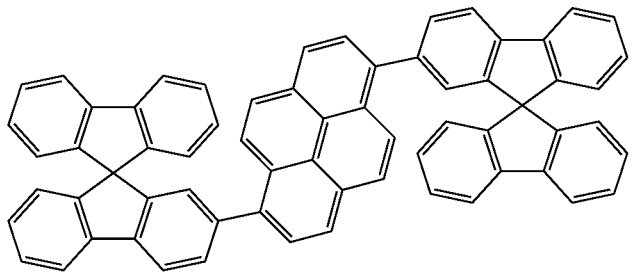

| Example | EML | ETC | Max. efficiency (cd/A) | Power efficiency @ 100 cd/m² (lm/W) | CIE (x, y) | Lifetime (h) at 10 mA/cm² |
|---|---|---|---|---|---|---|
| Example 1 (comparison) | EM1: 1% EM2 (40 nm) | AlQ₃ (30 nm) | 3.6 | 1.6 | 0.17/0.29 | 620 |
| Example 2 | EM1: 1% EM2 (30 nm) | E1 (30 nm) | 4.5 | 2.5 | 0.16/0.23 | 750 |
| Example 3 | EM1: 1% EM2 (40 nm) | E1 (30 nm) | 4.5 | 2.3 | 0.17/0.25 | 780 |
| Example 4 (comparison) | EM3: EM4 (2%) (30 nm) | AlQ₃ (20 nm) | 7.8 | 3.1 | 0.18/0.28 | 1100 |
| Example 5 | EM3: EM4 (2%) (30 nm) | E1 (10 nm) | 8.3 | 3.8 | 0.18/0.26 | 1600 |
| Example 6 | EM3: EM4 (2%) (32 nm) | E1 (20 nm) | 8.9 | 4.1 | 0.18/0.27 | 1800 |
| Example 7 | EM3: EM4 (2%) (30 nm) | E1 (30 nm) | 9.5 | 4.3 | 0.18/0.28 | 1700 |
| Example 8 | EM3: EM4 (2%) (30 nm) | E1 (40 nm) | 8.7 | 3.9 | 0.18/0.28 | 1500 |
| Example 9 (comparison) | EM3: EM5 (2%) (30 nm) | AlQ₃ (20 nm) | 3.6 | 1.7 | 0.15/0.17 | 1100 |
| Example 10 | EM3: EM5 (2%) (30 nm) | E1 (20 nm) | 3.9 | 2.1 | 0.15/0.15 | 1800 |
| Example 11 | EM3: EM5 (2%) (30 nm) | E1 (40 nm) | 4.3 | 2.2 | 0.15/0.16 | 1600 |
| Example 12 (comparison) | EM1 (100%) (30 nm) | AlQ₃ (20 nm) | 4.1 | 2.2 | 0.17/0.24 | 200 |
| Example 13 | E1: EM1 (75%) (30 nm) | AlQ₃ (20 nm) | 4.7 | 3.3 | 0.17/0.24 | 950 |
| Example 14 | E1: EM1 (90%) (30 nm) | AlQ₃ (20 nm) | 4.6 | 2.9 | 0.17/0.24 | 1020 |
| Example 15 (comparison) | EM6 (100%) (30 nm) | AlQ₃ (20 nm) | 3.9 | 2.8 | 0.15/0.15 | 150 |
| Example 16 | E1: EM6 (90%) (30 nm) | AlQ₃ (20 nm) | 4.1 | 2.4 | 0.15/0.15 | 550 |
| Example 17 | E1: EM6 (90%) (40 nm) | — | 4.2 | 4.0 | 0.15/0.15 | 530 |
| Example 18 (comparison) | EM7 (100%) (30 nm) | AlQ₃ (20 nm) | 4.5 | 2.3 | 0.17/0.25 | 250 |
| Example 19 | E1: EM7 (90%) (30 nm) | AlQ₃ (20 nm) | 5.2 | 2.4 | 0.17/0.25 | 640 |
| Example 20 | E1: EM7 (98%) (30 nm) | AlQ₃ (20 nm) | 5.4 | 2.7 | 0.17/0.25 | 710 |
| Example 21 | E1: EM7 (98%) (30 nm) | — | 7.2 | 4.2 | 0.17/0.25 | 550 |
| Example 22 | E1: EM7 (95%) (30 nm) | E5 (40 nm) | 7.2 | 6.4 | 0.16/0.23 | 750 |
| Example 23 | E1: EM4 (10%) (30 nm) | AlQ₃ (20 nm) | 8.6 | 4.7 | 0.18/0.28 | 1500 |
| Example 24 | E1: EM4 (15%) (30 nm) | AlQ₃ (20 nm) | 9.4 | 4.8 | 0.18/0.28 | 1400 |
| Example 25 | E1: EM4 (10%) (30 nm) | E1 (30 nm) | 9.2 | 5.1 | 0.18/0.27 | 1500 |

| | | | | | | |
|---|---|---|---|---|---|---|
| Example 26 | E1: EM4 (15%) (30 nm) | E1 (30 nm) | 9.6 | 5.3 | 0.18/0.27 | 1400 |
| Example 27 (comparison) | EM1: 1% EM2 (30 nm) | AlQ$_3$ (20 nm) | 4.3 | 1.9 | 0.17/0.23 | 640 |
| Example 28 (comparison) | EM1: 1% EM2 (30 nm) | AlQ$_3$ (40 nm) | 3.4 | 1.6 | 0.17/0.29 | 610 |
| Example 29 | EM1: 1% EM2 (30 nm) | E2 (20 nm) | 4.5 | 2.5 | 0.17/0.22 | 940 |
| Example 30 | EM1: 1% EM2 (30 nm) | E2 (40 nm) | 4.4 | 2.4 | 0.17/0.23 | 910 |
| Example 31 | EM1: 1% EM2 (30 nm) | E3 (20 nm) | 4.6 | 2.6 | 0.17/0.23 | 860 |
| Example 32 | EM1: 1% EM2 (30 nm) | E3 (40 nm) | 4.7 | 2.7 | 0.17/0.24 | 830 |
| Example 33 | EM1: 1% EM2 (30 nm) | E4 (20 nm) | 4.5 | 2.5 | 0.17/0.22 | 1050 |
| Example 34 | EM1: 1% EM2 (30 nm) | E4 (40 nm) | 4.7 | 2.4 | 0.17/0.23 | 1090 |

All OLEDs exhibit blue emission from the fluorescence emitters EM1 to EM7. Higher photometric efficiencies are obtained here in devices in which the electron conductor AlQ$_3$ has been replaced by the electron conductors according to the invention. Since the voltages required to achieve a certain brightness are also low here, very good power efficiency is obtained. Furthermore, the lifetime increases.

In particular, the efficiencies, the power efficiencies, the lifetime and the colour are better with the electron-transport materials according to the invention than with the standard electron conductor AlQ$_3$ for the same layer thickness of the ETC.

In summary, it can be stated that OLEDs manufactured in accordance with the novel design principle have higher efficiency at lower voltages and a longer lifetime, as is readily evident from Table 1.

The invention claimed is:

1. An electronic device comprising cathode, anode and at least one organic layer, characterised in that the organic layer comprises at least one defined compound A containing the chemical structural unit Y=X, which is selected from compounds of formula (2) to (4)

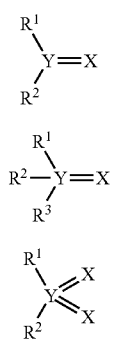

where the following applies to the symbols used:

Y is on each occurrence, P in formula (3) and S in formulae (2) and (4);

X is NR$^4$ in formula (3) and is on each occurrence, identically or differently NR$^4$ or O in formulae (2) and (4);

R$^1$, R$^2$ and R$^3$ is on each occurrence, identically or differently N(R$^4$)$_2$, a straight-chain, branched or cyclic alkyl group having 1 to 40 C atoms, which may be substituted by R$^5$ or also unsubstituted, where one or more non-adjacent —CH$_2$— groups may be replaced by —R$^6$C=CR$^6$—, —C≡C—, Si(R$^6$)$_2$, Ge(R$^6$)$_2$, Sn(R$^6$)$_2$, C=O, C=S, C=Se, C=NR$^6$, —O—, —S—, —NR$^6$— or —CONR$^6$— and where one or more H atoms may be replaced by F, Cl, Br, I, CN or NO$_2$; a plurality of radicals R$^1$, R$^2$ and/or R$^3$ here may with one another form a mono- or polycyclic, aliphatic or aromatic ring system;

or an aromatic or heteroaromatic system having 1 to 40 aromatic C atoms, which may be substituted by one or more radicals R$^5$ where a plurality of substituents R$^1$, R$^2$ and/or R$^3$ may with one another form a mono- or polycyclic, aliphatic or aromatic ring system, or an aromatic or heteroaromatic system having 1 to 40 aromatic C atoms which is bonded via a divalent group —Z—, where one or more H atoms may be replaced by F, Cl, Br or I or which may be substituted by one or more radicals R$^5$; a plurality of substituents R$^1$, R$^2$ and/or R$^3$ here may define a further mono- or polycyclic, aliphatic or aromatic ring system:

with the proviso that at least one of the radicals R$^1$, R$^2$ and/or R$^3$ stands for an aromatic or heteroaromatic system in formula (2) and (3) and that both radicals R$^1$ and R$^2$ stand for an aromatic or heteroaromatic system in formula (4);

R$^4$ is on each occurrence, identically or differently a straight-chain branched or cyclic alkyl or alkoxy chain having 1 to 22 C atoms, in which, in addition, one or more non-adjacent C atoms may be replaced by —R$^6$C=CR$^6$—, —C≡C—Si(R$^6$)$_2$, Ge(R$^6$)$_2$, Sn(R$^6$)$_2$, —NR$^6$—, —O—, —S—, —CO—, —CO—O—, —O—CO—O— and where one or more H atoms may be replaced by fluorine or is an aryl, heteroaryl, or an aryloxy group having 1 to 40 C atoms, which may also be substituted by one or more radicals R$^6$ or OH, NH$_2$, NH(R$^5$) or N(R$^5$)$_2$;

R$^5$ is on each occurrence, identically or differently, R$^4$ or CN, B(R$^6$) or Si(R$^6$)$_3$:

R$^6$ is on each occurrence, identically or differently, H or an aliphatic or aromatic hydrocarbon radical having 1 to 20 C atoms:

Z is on each occurrence, identically or differently, a conjugated radical having 1 to 40 C atoms, where one or more C atoms may be substituted by a radical R$^5$ or halogen;

with the proviso that compounds of the formula (4) with X=oxygen, consists of only elements carbon, hydrogen, oxygen and sulfur and that the compound A has a molecular weight of ≧150 g/mol and ≦10,000 g/mol and that the device comprises no phosphorescent emitters.

2. The electronic device according to claim 1, wherein X in the formula (2) or (4) is O.

3. The electronic device according to claim 1, wherein the compound of the formula (2) to (4) does not have a planar structure.

4. Electronic device according to claim 3, characterised in that at least one of the substituents $R^1$, $R^2$, $R^3$ and/or $R^4$ contains at least one $sp^3$-hybridised carbon, silicon, germanium and/or nitrogen atom.

5. Electronic device according to claim 4, characterised in that at least one of the $sp^3$-hybridised atoms is a secondary, tertiary or quaternary atom.

6. Electronic device according to claim 5, characterised in that at least one of the $sp^3$-hybridised atoms is a quaternary atom.

7. Electronic device according to claim 3, characterised in that the non-planar radical $R^1$ or $R^2$ or $R^3$ represents a biaryl group.

8. The electronic device according to claim 1, wherein compound A contains a 9,9'-spirobifluorene derivative, a 9,9-disubstituted fluorene derivative, a 6,6- and/or 12,12-di- or tetrasubstituted indenofluorene derivative, a triptycene derivative, a dihydrophenanthrene derivative or a hexaarylbenzene derivative.

9. The electronic device according to claim 1, wherein compound A contains a 9,9'-spirobifluorene derivative.

10. Electronic device according to claim 1, characterised in that the compound A is amorphous and the glass transition temperature $T_g$ of the compound A is greater than 100° C.

11. Electronic device according to claim 1, characterised in that the compound A is employed as electron-transport material.

12. The electronic device according to claim 1, wherein the layer comprising compound A comprises at least 50% of this compound.

13. The electronic device according to claim 1, wherein the organic layer consists of compound A as pure layer.

14. Electronic devices according to claim 1, wherein in the electronic device is an organic electroluminescent device, organic thin-film transistor, organic field-effect transistor, organic solar cell, organic photoreceptor or organic laser.

15. Electronic device according to claim 1, characterised in that further layers are present in addition to the layer comprising the compound A.

16. Electronic device according to claim 15, characterised in that these further layers are selected from hole-injection layer, hole-transport layer, emission layer, hole-blocking layer, electron-transport layer and/or electron-injection layer.

17. Electronic device according to claim 1, which further comprises a fluorescent emission layer and said organic layer is wherein at least one electron-transport layer comprising at least one compound A and said electron-transport layer is present between the fluorescent emission layer and the cathode.

18. Electronic device according to claim 1, which further comprises an emission layer and the emission layer comprises at least one fluorescent emitter and at least one electron-transport material, where the electron-transport material comprises at least one compound A.

19. Electronic device according to claim 1, characterised in that both an electron-transport layer comprising at least one compound A and an emission layer comprising at least one compound A, which may be identical or different, are present.

20. Electronic device according to claim 1, wherein the organic layer is an emission layer and the emission layer comprising the compound A is directly adjacent to the electron-injection layer or the cathode without the use of a separate electron-transport layer.

21. Electronic device according to claim 1, wherein the organic layer is an emission layer and the emission layer comprising the compound A is directly adjacent to the hole-injection layer.

22. Electronic device according to claim 1, characterised in that it is an organic electroluminescent device in which the emitter(s) fluoresce(s) in the visible spectral region with one or more maxima between 380 nm and 750 nm on suitable excitation.

23. An electronic device, cathode, anode and at least one organic layer, wherein the organic layer comprises at least one defined-compound A containing a compound of the examples 1 to 52

Example 1

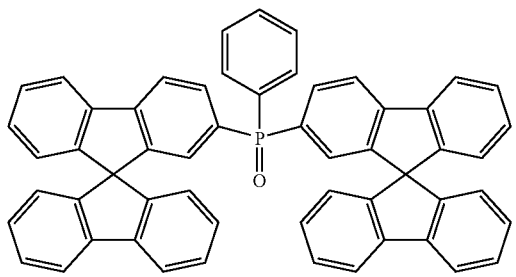

Example 5

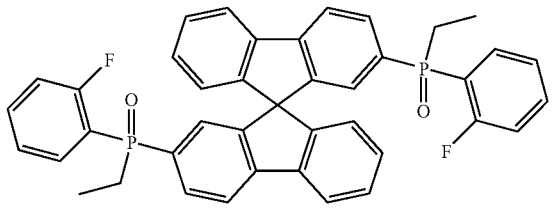

Example 6

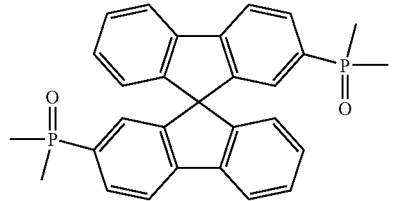

Example 7

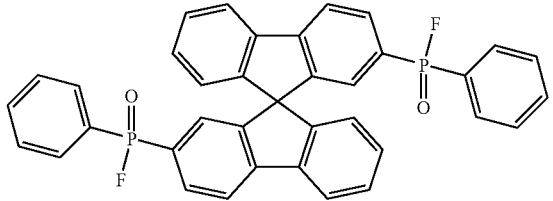

Example 8

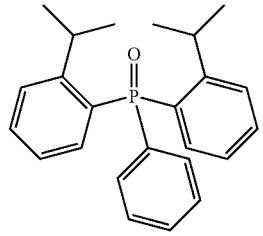

-continued
Example 9
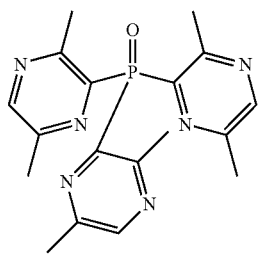
Example 10
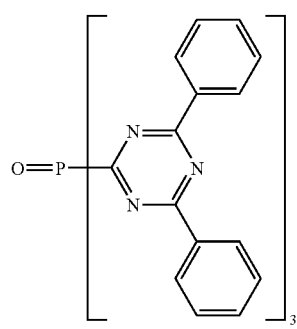
Example 11
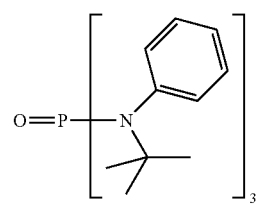
Example 12
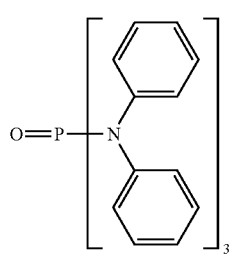
Example 13
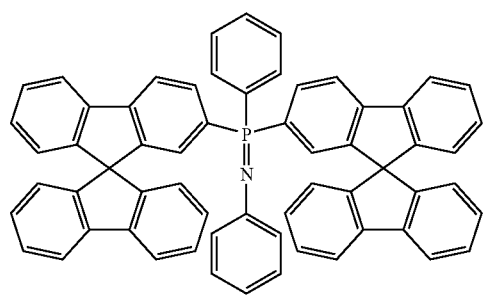
-continued
Example 14
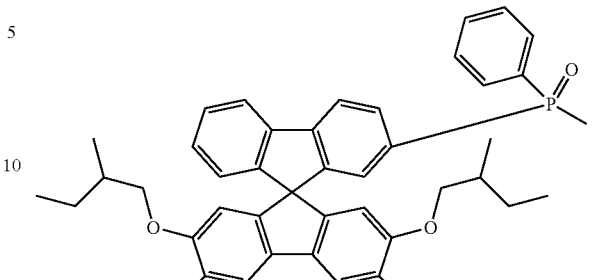
Example 15
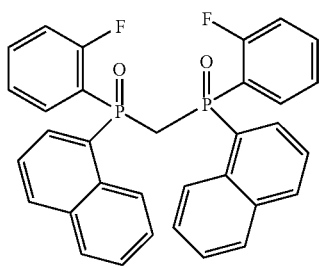
Example 16
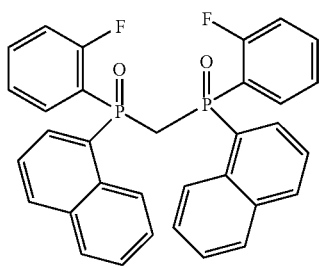
Example 17

-continued
Example 18
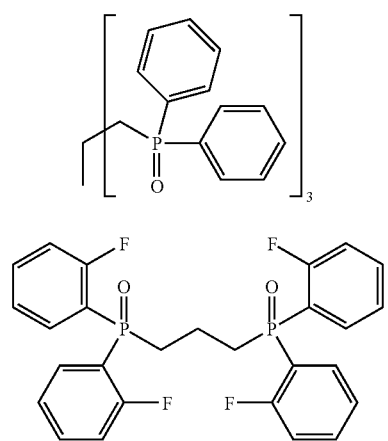
Example 19
Example 20
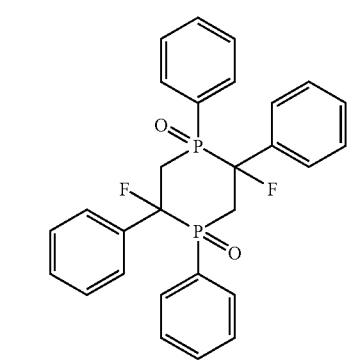
Example 21
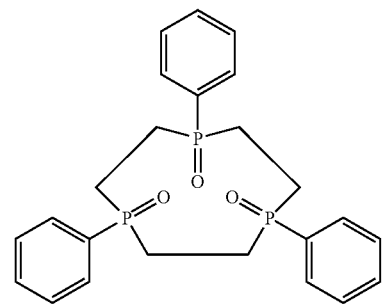
Example 22
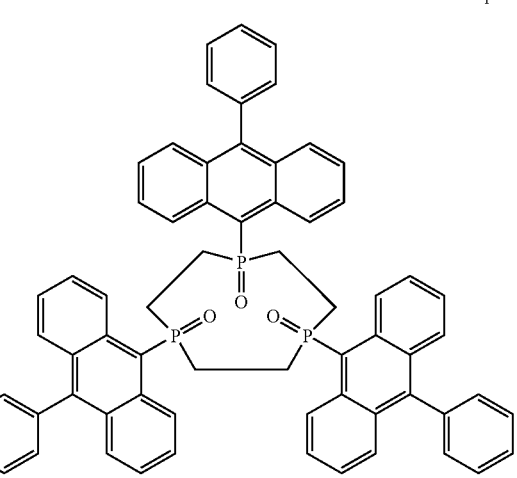
-continued
Example 23
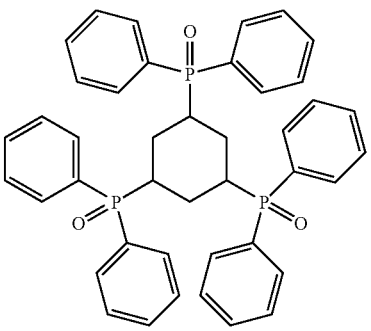
Example 24
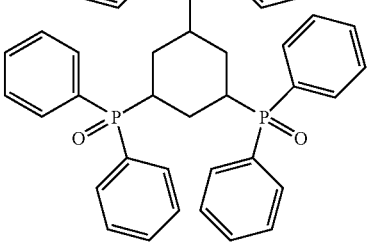
Example 25
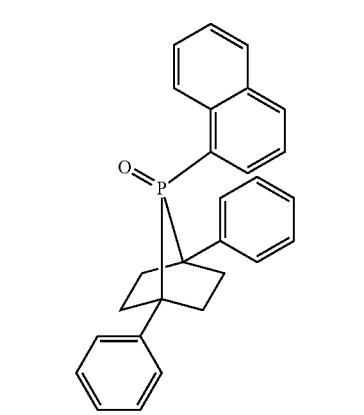
Example 26
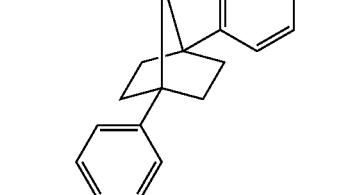
Example 27
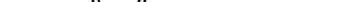

-continued
Example 28
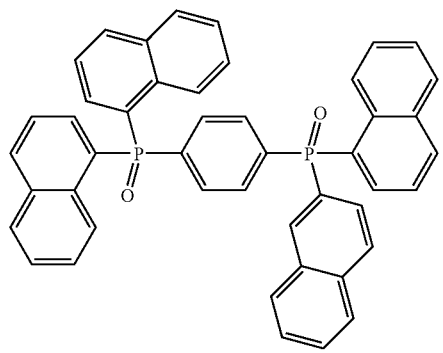
Example 29
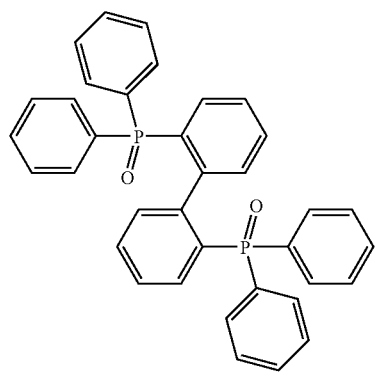
Example 30
Example 31
Example 32
Example 33
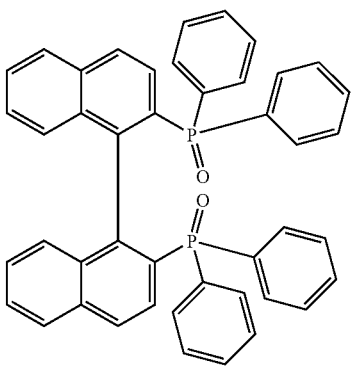
Example 34
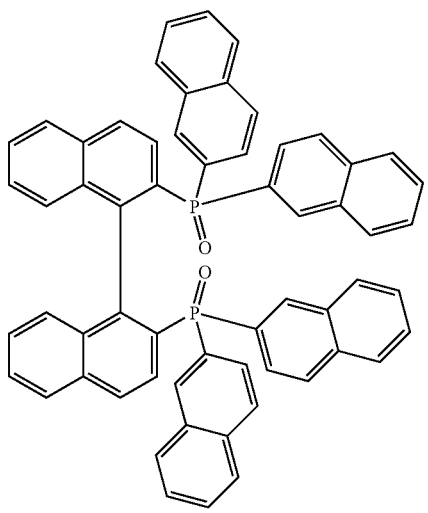
Example 35
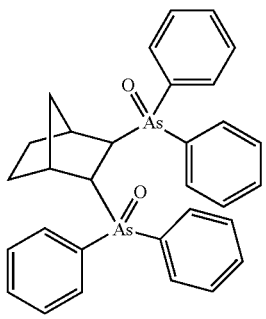
Example 36
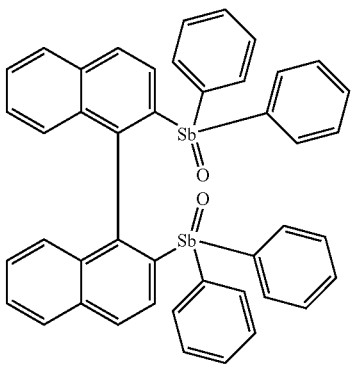

-continued
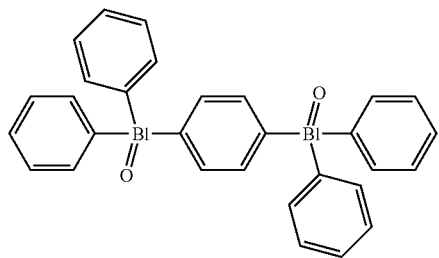
Example 37
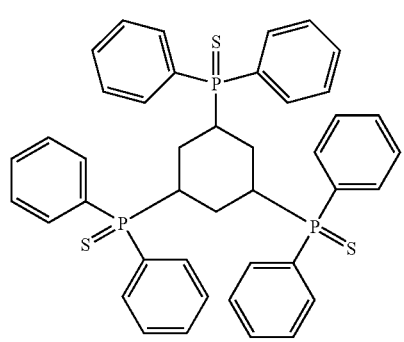
Example 38
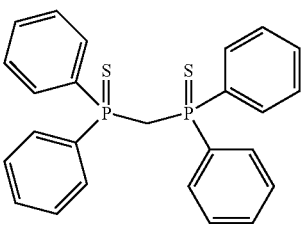
Example 39
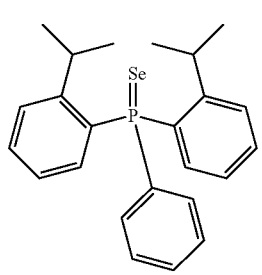
Example 40
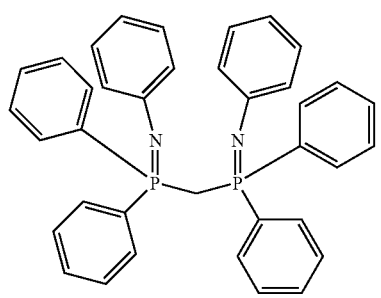
Example 41
-continued
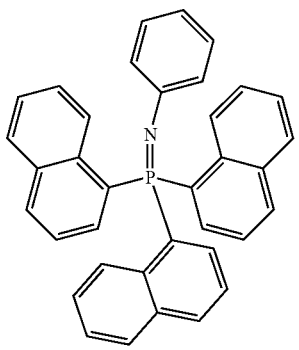
Example 42
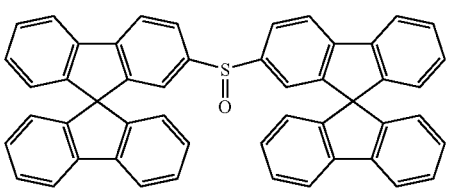
Example 43
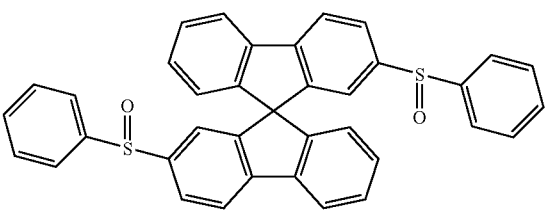
Example 44
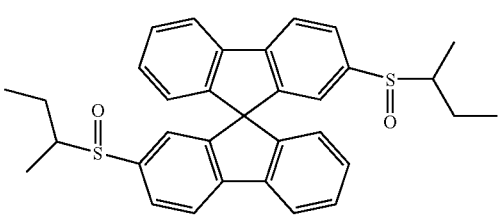
Example 45
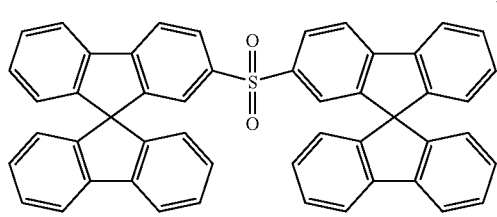
Example 46
Example 47

Example 48
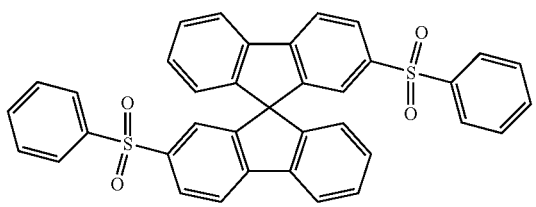
Example 49
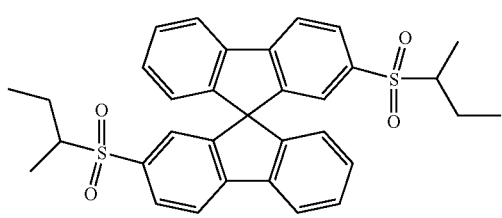
Example 50
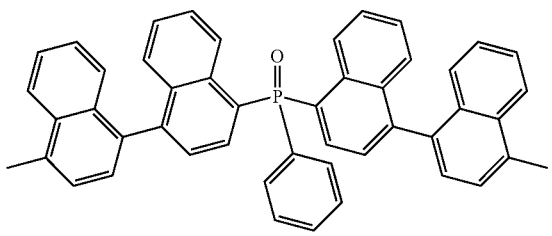
Example 51
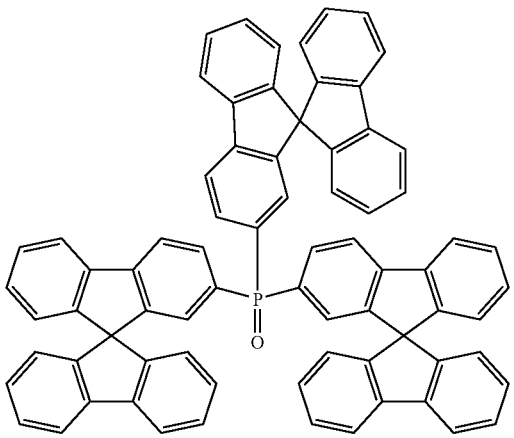
Example 52
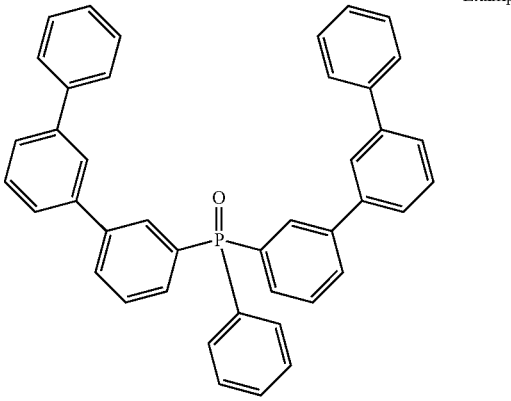
with the proviso that the compound A has a molecular weight of $\geq 150$ g/mol and $\leq 10,000$ g/mol and that the device comprises no phosphorescent emitters.
* * * * *